United States Patent
Ahn et al.

(10) Patent No.: US 11,335,853 B2
(45) Date of Patent: May 17, 2022

(54) METHOD OF MANUFACTURING OTS DEVICE, AND OTS DEVICE

(71) Applicant: ULVAC, INC., Chigasaki (JP)

(72) Inventors: Hyung-Woo Ahn, Chigasaki (JP); Kazumasa Horita, Chigasaki (JP); Takahiko Sawada, Chigasaki (JP); Tadashi Yamamoto, Chigasaki (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 16/484,715

(22) PCT Filed: Oct. 24, 2018

(86) PCT No.: PCT/JP2018/039423
§ 371 (c)(1),
(2) Date: Aug. 8, 2019

(87) PCT Pub. No.: WO2020/084703
PCT Pub. Date: Apr. 30, 2020

(65) Prior Publication Data
US 2021/0336137 A1 Oct. 28, 2021

(51) Int. Cl.
*H01L 45/00* (2006.01)

(52) U.S. Cl.
CPC ...... *H01L 45/1675* (2013.01); *H01L 45/1253* (2013.01); *H01L 45/06* (2013.01); *H01L 45/1233* (2013.01); *H01L 45/148* (2013.01)

(58) Field of Classification Search
CPC combination set(s) only.
See application file for complete search history.

(56) References Cited

U.S. PATENT DOCUMENTS

2005/0030800 A1* 2/2005 Johnson ............... H01L 45/06
365/200
2006/0289848 A1 12/2006 Dennison
(Continued)

FOREIGN PATENT DOCUMENTS

JP 2010-62247 3/2010
JP 2010-87008 4/2010
(Continued)

OTHER PUBLICATIONS

Ahn et al., "Effect of density of localized states on the ovonic threshold switching characteristics of the amorphous GeSe films", Applied Physics Letters, 103, pp. 042908-1-042908-3, 2013, South Korea.
(Continued)

*Primary Examiner* — Mounir S Amer
(74) *Attorney, Agent, or Firm* — Grossman, Tucker, Perreault & Pfleger, PLLC

(57) ABSTRACT

A method of manufacturing an OTS device of the invention is a method of manufacturing OTS device including a first conductor, an OTS portion made of chalcogenide, and a second conductor which are layered in order and disposed on an insulating substrate. The manufacturing method includes: a step D of forming a resist so as to coat part of an upper surface of the second conductor; a step E of dry etching a region which is not coated with the resist; and a step F of ashing the resist. In the step E, the second conductor, all of the OTS portion, and an upper portion of the first conductor are removed by an etching treatment once in a depth direction of the region.

5 Claims, 18 Drawing Sheets

(56) References Cited

U.S. PATENT DOCUMENTS

| | | | |
|---|---|---|---|
| 2008/0096344 A1 | 4/2008 | Lai et al. | |
| 2010/0078616 A1 | 4/2010 | Seko et al. | |
| 2010/0108977 A1* | 5/2010 | Yoon | H01L 45/06 257/4 |
| 2010/0221896 A1* | 9/2010 | Sandoval | H01L 45/16 438/478 |
| 2011/0155987 A1 | 6/2011 | Mizuguchi et al. | |
| 2012/0313064 A1 | 12/2012 | Nishimura | |
| 2016/0181321 A1* | 6/2016 | Jung | H01L 45/141 257/4 |
| 2016/0307837 A1* | 10/2016 | Park | H01L 27/088 |
| 2017/0244026 A1 | 8/2017 | Wu et al. | |
| 2017/0317139 A1* | 11/2017 | Seong | H01L 45/144 |

FOREIGN PATENT DOCUMENTS

| | | |
|---|---|---|
| JP | 2011-66450 | 3/2011 |
| JP | 2011-146458 | 7/2011 |
| JP | 2011-233917 | 11/2011 |
| JP | 2013-4540 | 1/2013 |
| JP | 2016-540370 | 12/2016 |
| JP | 2017-510983 | 4/2017 |

OTHER PUBLICATIONS

Kim et al., "Effect of Ge Concentration in GexSe1-x Chalcogenide Glass on the Electronic Structures and the Characteristics of Ovonic Threshold Switching (OTS) Devices", ECS Solid State Letters, 2(10), pp. Q75-Q77, 2013.

International Search Report from corresponding PCT Application No. PCT/JP2018/039423 dated Jan. 22, 2019. English translation attached.

Office Action from related Japanese Appln. No. 2017-193101 dated Feb. 18, 2020. English translation attached.

* cited by examiner

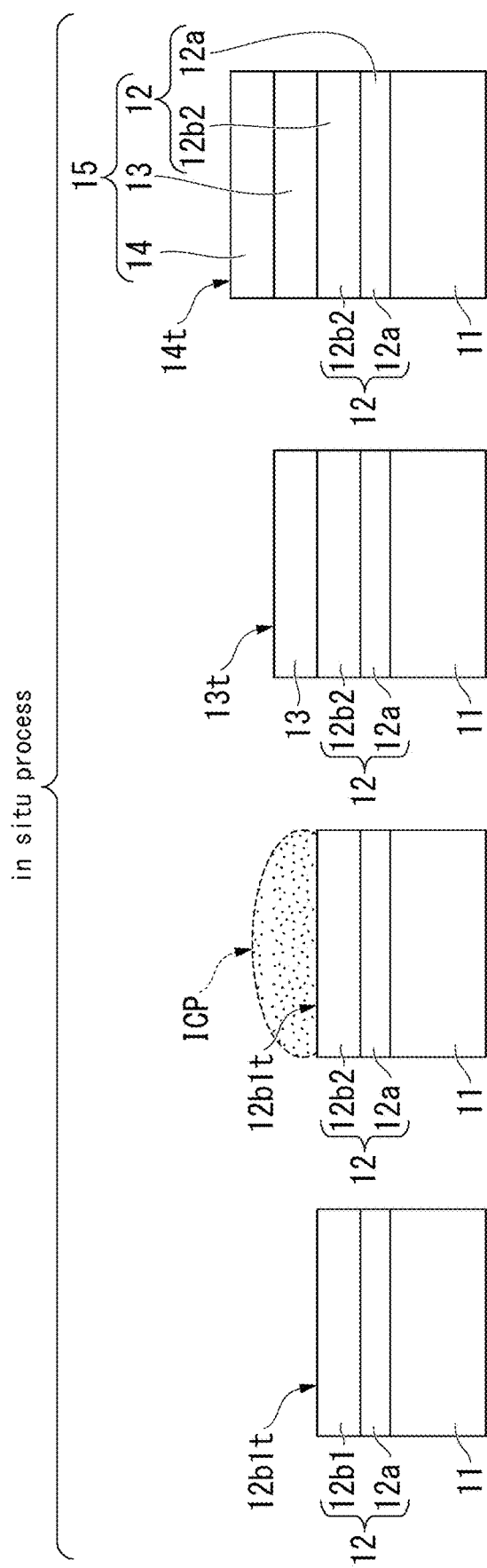
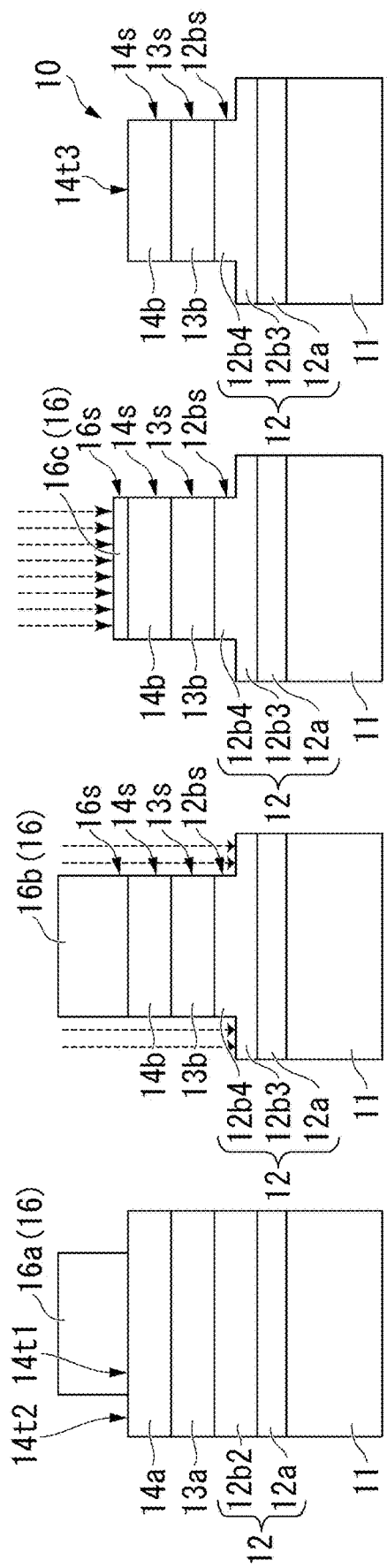

RMS: 0.51nm
Peak to Valley: 5.4nm

RMS: 0.32nm
Peak to Valley: 3.3nm (a) Current flow through entire active materials meets electrode area.
(b) Forming of conductive filament.
(c) Devices edge effect.

(a) Current flow through entire active materials meets electrode area.
(b) Forming of conductive filament.
(c) Devices edge effect.

Bottom to Bottom

Bottom to Bottom

METHOD OF MANUFACTURING OTS DEVICE, AND OTS DEVICE

TECHNICAL FIELD

The present invention relates to a method of manufacturing an OTS device that can achieve stable characteristics of an ovonic threshold switch (OTS: Ovonic Threshold Switch) device.

BACKGROUND ART

As the evolution of electronic devices based on Si has reached its limits, innovative operating mechanisms and innovative materials are expected. Among these, chalcogenide (chalcogenide (for example, Ge—Se, Ge—Se—Si, or the like)) glass has excellent electric characteristics and thereby has been attracted attention as the aforementioned material (Non-Patent Document 1). The excellent electric characteristics are the characteristics referred to as threshold switch (TS: Threshold Switch) operation. Accordingly, a phase change memory (phase-change-memory) is commercialized which is a diode selector known as a non-volatile memory device and utilizes a phenomenon referred to as TS crystallization.

Furthermore, such OTS is a hopeful candidate for other devices, for example, a metal oxide silicon field effect transmitter (MOSFET: Metal-Oxide Silicon Field-Effect Transmitter), a bipolar junction transistor (BJT: Bipolar Junction Transistor), a cell selection device such as a PN diode, or the like. Particularly, since the OTS withstands a high driving current and improves design efficiency, it has high potential for a three-dimensional stack memory device.

The above-described chalcogenide is essential to manufacture an excellent OTS. However, there is a problem in that the aforementioned chalcogenide material used for threshold type selector (Threshold type selector) becomes degraded in threshold voltage (Threshold voltage) due to air exposure and therefore characteristics of the OTS device become unstable.

Additionally, at the position above and below the portion made of chalcogenide of the OTS, electrode portions are provided which are continuously formed at the portion. The top and bottom electrode portions are formed of materials having etching rates different from each other. Consequently, in order to form the above-described configuration, conventionally, chemical reaction etching (chemical reaction etching) using various gases two or more times has been carried out. That is, as a method of forming a layered body including the portion made of chalcogenide and the electrode portions formed at the position above and below thereof, it has been difficult to carry out an etching treatment at one time (once) in a depth direction of the layered body, that is, carry out etching using the same gas without using various gases.

Therefore, development a method of manufacturing an OTS device has been expected which can achieve stable characteristics of the OTS device by a simple etching treatment.

PRIOR ART DOCUMENTS

Non Patent Documents (Non-Patent Document 1) Hyung-Woo Ahn et al., Appl. Phys. Lett., 103, 042908 (2013).

SUMMARY OF THE INVENTION

Problems to be Solved by the Invention

The invention was made in view of the above-described situation, and has an object to provide a method of manufacturing an OTS device, which can achieve stable characteristics of the OTS device by a simple etching treatment.

Means for Solving the Problems

A method of manufacturing an OTS device according to the first aspect of the invention is a method of manufacturing an OTS device including a first conductor, an OTS portion made of chalcogenide, and a second conductor which are layered in order and disposed on an insulating substrate. The method includes: a step A of forming the first conductor over an entire area a surface of the substrate; a step B of forming the OTS portion over an entire area of the first conductor; a step C of forming the second conductor over an entire area of the OTS portion; a step D of forming a resist so as to coat part of an upper surface of the second conductor; a step E of dry etching a region which is not coated with the resist; and a step F of ashing the resist. In the step E, the second conductor, all of the OTS portion, and an upper portion of the first conductor are removed by an etching treatment at one time (once) using Ar gas in a depth direction of the region.

In the method of manufacturing an OTS device according to the first aspect of the invention, the step A, the step B, and the step C are all carried out in a space under reduced pressure, and the steps A, B, and C may be sequent in-situ process.

The method of manufacturing an OTS device according to the first aspect of the invention, further includes a step X that is carried out between the step A and the step B, and the step X may carry out a flattening treatment by an inductively-coupled plasma (ICP: Inductively Coupled Plasma) method using Ar gas with respect to a surface of the first conductor formed by the step A.

In the method of manufacturing an OTS device according to the first aspect of the invention, the dry etching of the step E may be a plasma treatment using Ar gas.

An OTS device according to a second aspect of the invention includes a first conductor, an OTS portion made of chalcogenide, and a second conductor which are layered in order and disposed on an insulating substrate, wherein when surface roughness of the first conductor is defined as $R_{p-v}$ and a thickness of the OTS portion is defined as $T_x$, relational expression of $R_{p-v} \leq (T_x/10)$ is satisfied.

An OTS device according to the second aspect of the invention, wherein the surface roughness $R_{p-v}$ of the first conductor may be less than or equal to 3.3 nm.

Effects of the Invention

The method of manufacturing an OTS device according to the first aspect of the invention includes the step A to the step F and removes the second conductor, all of the OTS portion, and the upper portion of the first conductor by an etching treatment at one time (once) using Ar gas in the step E in the depth direction of the region which is not coated with the resist. Consequently, on the cross-sectional surface of the layered body configured of the second conductor that was subjected to etching, the OTS portion, and the upper portion of the first conductor, it is possible to process the layered body so as to obtain the shape such that the side surfaces of the second conductor, the OTS portion, and the first conductor are on the same plane.

Conventionally, chemical reaction etching (chemical reaction etching) has been carried out for each of members constituting a layered body by use of an individual gas. In contrast, according to the method of manufacturing an OTS device according to the first aspect of the invention, since the layered body can be removed by an etching treatment at one time (once), simplified processing is achieved, and a low-cost manufacturing process can be realized.

It is preferable that, when such layered body is formed, the step A, the step B, and the step C be all carried out in a space under reduced pressure and that such three steps A, B, and C be sequent in-situ process. Because of this, the surface of the first conductor formed on the substrate is flattened by the step A, and irregularities are less likely to be generated thereon. Accordingly, irregularities are also suppressed from being generated on the surfaces of the OTS portion and the second conductor which are formed and layered on the first conductor in order. Thus, in the case where a voltage is applied to the OTS portion by the conductors located above and below the OTS portion, since concentration phenomenon of a field is less likely to occur, stability of a device (OTS device) is achieved.

Furthermore, the step X is carried out between the step A and the step B, and the step X causes the surface of the first conductor formed by the step A to be subjected to a flattening treatment by an inductively-coupled plasma (ICP: Inductively Coupled Plasma) method using Ar gas. For this reason, the flattening of the aforementioned first conductor is further improved.

Therefore, in the method of manufacturing an OTS device according to the first aspect of the invention, the layered body configured of the first conductor, the OTS portion, and the second conductor (metal-active-metal layer) is formed by in-situ process, and the layered body can be processed by etching at one time (once). Consequently, the method of manufacturing an OTS device according to the first aspect extremely easily contributes to manufacture of crossbar type memory. For this reason, the invention is effective in the field of resisitive memories such as ReRAM, CBRAM, or the like in which use of OTS is expected in future, and memories having a crossbar structure.

The OTS device according to the second aspect of the invention includes a first conductor, an OTS portion made of chalcogenide, and a second conductor which are layered in order and disposed on an insulating substrate, wherein when surface roughness of the first conductor is defined as $R_{p-v}$ and a thickness of the OTS portion is defined as $T_x$, relational expression of $R_{p-v} \leq (T_x/10)$ is satisfied. Consequently, in the case where a voltage is applied to the OTS portion by the conductors located above and below the OTS portion, stability of a device (OTS device) is achieved.

In the case where the aforementioned relational expression is satisfied and the surface roughness $R_{p-v}$ of the first conductor may be less than or equal to 3.3 nm, stability of a device (OTS device) is further achieved.

BRIEF DESCRIPTION OF THE DRAWINGS

FIGS. 2A, 2B, 2C, 2D, 2E, 2F, 2G, and 2H are schematic cross-sectional views showing the method of manufacturing an OTS device according to the embodiment of the invention.

EMBODIMENTS FOR CARRYING OUT THE INVENTION

Hereinafter, a method of manufacturing an OTS device and an OTS device according to an embodiment of the invention will be described with reference to drawings.

Figure 1:
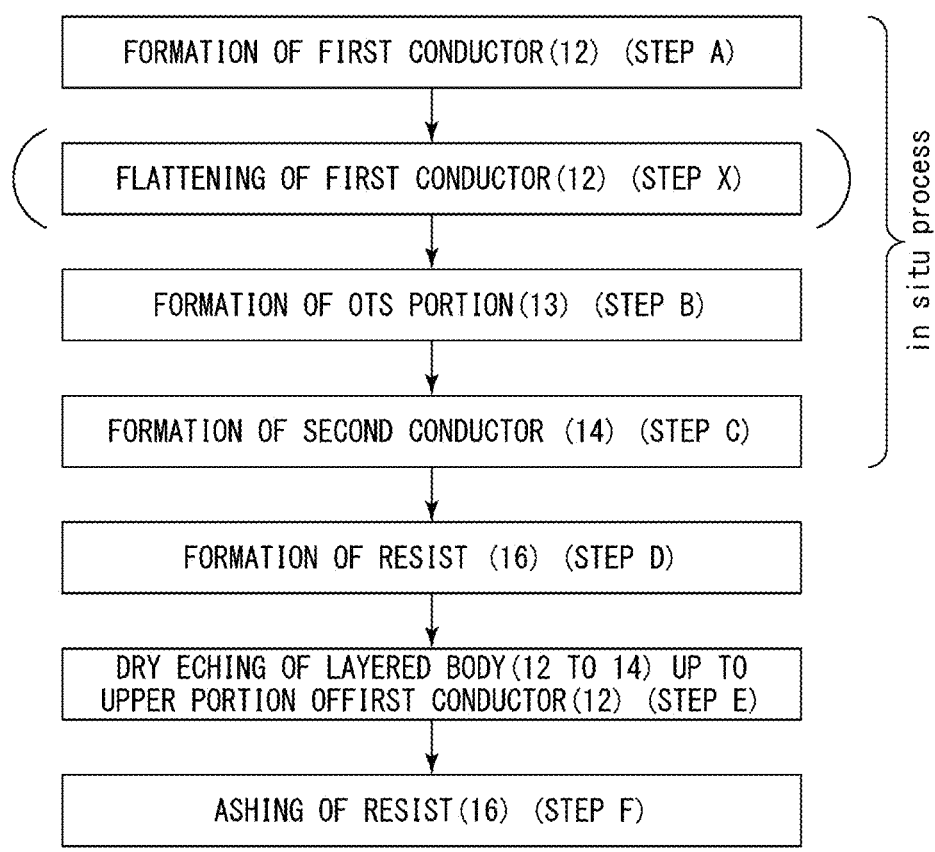
FIG. 1 is a flowchart showing a method of manufacturing an OTS device according to an embodiment of the invention.

FIG. 1 is a flowchart showing a method of manufacturing an OTS device according to an embodiment of the invention, and FIG. 2 is a schematic cross-sectional view showing the method of manufacturing an OTS device according to the embodiment of the invention.

The method of manufacturing an OTS device according to the embodiment of the invention is a method of manufacturing an OTS device including a first conductor, an OTS portion made of chalcogenide, and a second conductor which are layered in order and disposed on an insulating substrate, and includes steps A to F which will be described later.

In the step A, a first conductor 12 is formed over an entire area of a surface (upper surface shown in FIG. 2(a)) of a substrate 11 (FIG. 2(a)). The first conductor 12 is formed by, for example, a sputtering method. A configuration of the first conductor 12 is not limited to a single-layer film, and a layered film having a plurality of films which are layered therein may be adopted. As the first conductor 12, Pt, TiN, Mo, W, C, or the like are preferably used. In the example shown in FIG. 2(a), the first conductor 12 is formed of two layers, a lower layer 12a is formed of Ti, and an upper layer 12b is formed of Pt.

In the step B, an OTS portion is formed over an entire area of the first conductor 12 so as to coat a surface of the first conductor 12 (FIG. 2(c)). The OTS portion 13 is formed by, for example, a sputtering method.

As the OTS portion 13, chalcogenide (chalcogenide (for example, Ge—Se, Ge—As—Se—Te, Ge—As, Ge—Te, Si—As—Te, Si—Ge—As—Te, Ge—As—Te, As—Te, Si—Ge—As—Se, or the like, into which Ge—Se, Sb (Bi or As) are doped)) is preferably used.

In the step C, a second conductor 14 is formed over an entire area of the OTS portion 13 so as to coat a surface of the OTS portion 13 (FIG. 2(d)). The second conductor 14 is formed by, for example, a sputtering method. As the second conductor 14, Pt, TiN, Mo, W, C, or the like are preferably used.

In the method of manufacturing an OTS device according to the embodiment of the invention, a series of the processes which are the above-mentioned steps A, B, and C are all are carried out under a reduced-pressure atmosphere (in-situ process). That is, not only in each step but also between the steps, the first conductor 12, the OTS portion 13, and the second conductor 14 are never exposed to an air atmosphere. For this reason, a layered body 15 configured of the first conductor 12, the OTS portion 13, and the second conductor 14a which are formed on a surface of the substrate 11 is obtained. Particularly, since the series of the processes which are the steps A, B, and C is carried out under a reduced-pressure atmosphere (in-situ process), the surface of the first conductor formed on the substrate is flattened by the step A, and irregularities are less likely to be generated thereon. Accordingly, irregularities are also suppressed from being generated on the surfaces of an OTS portion and a second conductor to be formed and layered on the first conductor in order. The series of the processes which are the steps A, B, and C is carried out under a reduced-pressure atmosphere by use of, for example, a film formation apparatus (FIG. 3) which will be described later.

In the step D, resist 16a (16) is formed so as to coat part of the upper surface of the second conductor 14 (FIG. 2(e)). The patterned resist 16 as described above is manufactured by applying, for example, a desired resist (photosensitive liquid) to a surface of a processing object (substrate/first conductor/OTS portion/second conductor) (that is, upper surface of the second conductor) and thereafter by sequentially carrying out exposure, develop, and etching in order. Consequently, the region 14t1 which is coated with the resist and the region 14t2 which is not coated with the resist are formed on the upper surface of the second conductor 14a.

In the step E, the region 14t2 which is not coated with the resist 16 is subjected to dry etching (FIG. 2(f)). As described above, the series of the processes which are the steps A, B, and C are all carried out under a reduced-pressure atmosphere (in-situ process). Accordingly, localized irregularities exist little on the surface of the first conductor 12, and the OTS portion 13 and the second conductor 14 which are formed above the first conductor 12 also have an extremely flat surface profile. For this reason, in the step E of the method of manufacturing an OTS device according to the embodiment of the invention, as a result of a plasma treatment using only Ar gas, the second conductor 14, all of the OTS portion 13, and the upper portion of the first conductor 12 can be removed by an etching treatment using Ar gas at one time (once) in the depth direction of the region 14t2 which is not coated with the resist 16. The arrow of the dotted line shown in FIG. 2(f) represents the etching direction with respect to the second conductor 14, all of the OTS portion 13, and the upper portion of the first conductor 12. As a result, the side surface 14s of the second conductor 14b, the side surface 13s of the OTS portion 13, and the side surface 12bs of the upper portion 12b4 of the first conductor, which are formed by etching, are processed to be on the same plane so as to be aligned with the side surface 16s of the resist 16.

In the step F, the resist 16 is subjected to ashing (FIG. 2(g)). The arrow of the dotted line shown in FIG. 2(g) represents the ashing direction with respect to the upper surface of the resist 16. Therefore, the thickness of the resist 16c is reduced, and the upper surface 14t3 of the second conductor 14b is finally in a state of being exposed. As a result, the OTS device 10 according to the embodiment of the invention is obtained (FIG. 2(h)).

Note that, the above-described method of manufacturing an OTS device according to the embodiment of the invention (steps A to F) may include a step X that is carried out between the step A and step B. In the step X, the surface 12b1t of the first conductor 12 formed by the step A is subjected to a flattening treatment by an inductively-coupled plasma (ICP: Inductively Coupled Plasma) method using Ar gas (FIG. 2(b)). Accordingly, the surface of the first conductor is further flattened, and irregularities are less likely to be generated thereon. Consequently, irregularities are also significantly suppressed from being generated on the surfaces of the OTS portion and the second conductor which are formed and layered on the first conductor in order.

Figure 3:
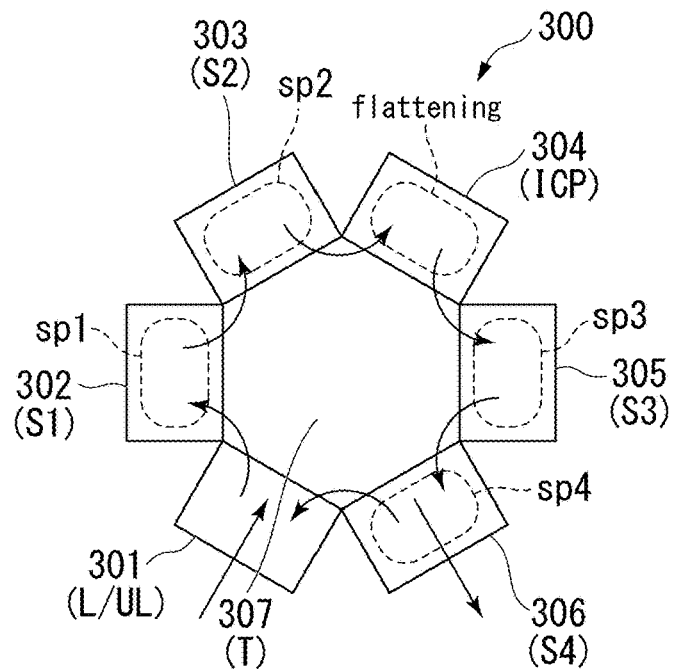
FIG. 3 is a schematic plan view showing an OTS device manufacturing apparatus according to the embodiment of the invention and is a view showing a manufacturing apparatus that is used to form a layered body configured of a first conductor, an OTS portion, and a second conductor.

FIG. 3 is a schematic plan view showing an OTS device manufacturing apparatus according to the embodiment of the invention. The manufacturing apparatus 300 shown in FIG. 3 is used to form the layered body configured of the first conductor, the OTS portion, and the second conductor in the aforementioned step A (→step X)→step B→step C.

In the manufacturing apparatus 300, a series of the processes which are all of the step A, (the step X), the step B, and the step C is carried out in independent decompression chambers of separated processing chamber (chambers).

A transfer pathway (transfer direction is represented by the arrow shown in FIG. 3) of the processing object (substrate) in the case where each of processes of the step A, (the step X), the step B, the step C is carried out by using the manufacturing apparatus 300 having such multichamber will be described. First of all, the processing object is transferred from outside to a load/unload chamber (L/UL) 301, and the inside of the load chamber is under a reduced-pressure atmosphere.

Next, the processing object waits in the load chamber under reduced pressure for a predetermined amount of time and thereafter is transferred from the load/unload chamber (L/UL) 301 through a transfer chamber (T) 307 to the inside of a first film forming chamber (S1) 302 in which the step A is to be carried out, and film formation of the lower layer 12a of the first conductor 12 is carried out thereon in a first film formation space sp1. Thereafter, the processing object on which the lower layer 12a is formed is transferred from the first film forming chamber (S1) 302 through the transfer chamber (T) 307 to the inside of a second film forming chamber (S2) 303, and film formation of the upper layer 12b of the first conductor 12 is carried out thereon in a second film formation space sp2.

Subsequently, as appropriate, the processing object on which the first conductor 12 is formed is transferred from the second film forming chamber (S2) 303 through the transfer chamber (T) 307 to the inside of a surface treatment chamber (ICP) 304, and a surface treatment with respect to the upper layer 12b of the first conductor 12 is carried out in a surface treatment space (flattening). The processing object may be transferred from the second film forming chamber (S2) 303 through the transfer chamber (T) 307 to a third film forming chamber 305 which will be described next without carrying out this surface treatment.

After that, the processing object on which the first conductor 12 is formed is transferred from the surface treatment chamber (ICP) 304 through the transfer chamber (T) 307 to the inside of the third film forming chamber (S3) 305, and film formation of the OTS portion 13 is carried out thereon in a third film formation space sp3.

Next, the processing object on which the OTS portion 13 is formed is transferred from the third film forming chamber (S3) 305 through the transfer chamber (T) 307 to the inside of a fourth film forming chamber (S4) 306, and film formation of the second conductor 14 is carried out thereon in a fourth film formation space sp4.

Subsequently, the processing object on which the layered body (the first conductor 12, the OTS portion 13, and the second conductor 14) is formed is transferred to the load/unload chamber (L/UL) 301 through the transfer chamber (T) 307 from the fourth film forming chamber (S4) 306 serving as the film forming chamber in which the final processing was carried out. The processing object waits in the load/unload chamber (L/UL) 301 for a predetermined amount of time and thereafter is transferred from the load/unload chamber (L/UL) 301 to outside.

As a transfer device transferring the processing object between the chambers, a robot (not shown in the figure) provided in the transfer chamber (T) 307 is used. Note that, when processing is being carried out or transferring is being carried out in each chamber, the internal space of each of chambers 301 to 306 in addition to that of the transfer chamber (T) 307 are all under reduced pressure.

That is, the manufacturing apparatus 300 includes at least the first film formation space sp1 and the second film formation space sp2 which form the first conductor 12, the third film formation space sp3 which forms the OTS portion 13, and the fourth film formation space sp4 which forms the second conductor 14. Additionally, as appropriate, the manufacturing apparatus 300 also includes the surface treatment chamber (ICP) 304 having a surface treatment space (flattening) in which the processing object on which the first conductor 12 is formed is processed.

Figure 4:
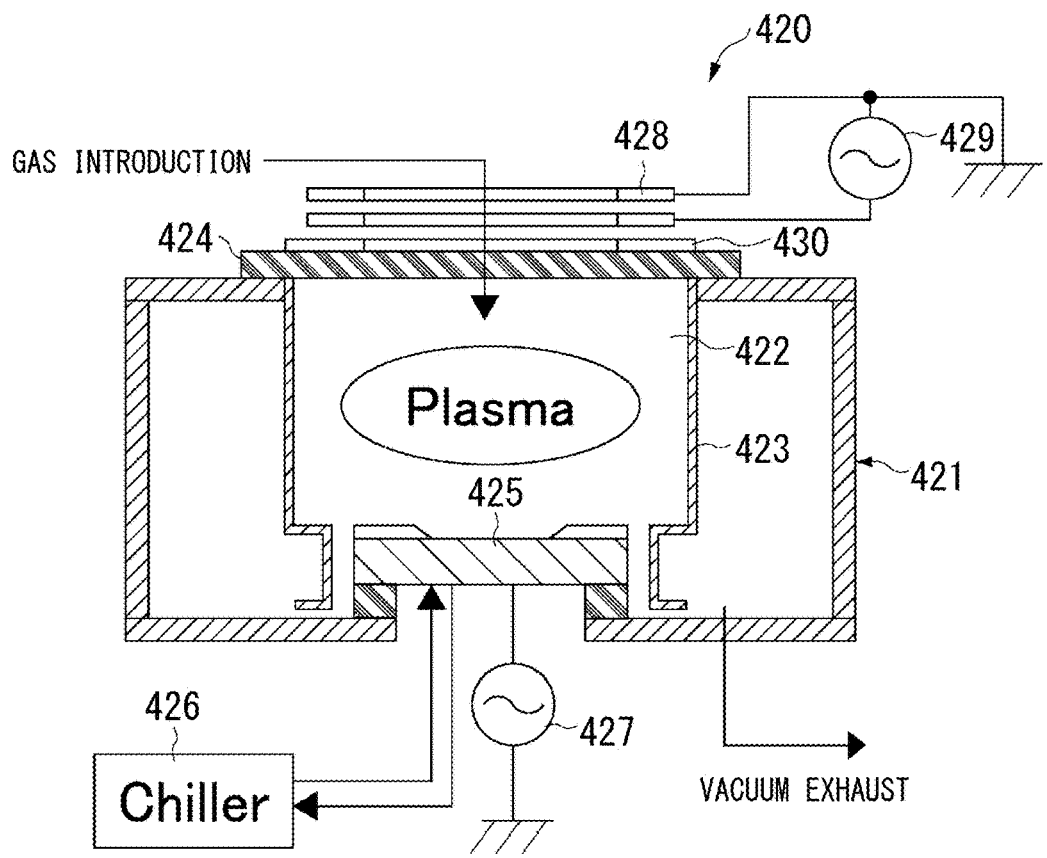
FIG. 4 is a schematic cross-sectional view showing an OTS device manufacturing apparatus according to the embodiment of the invention and is a view showing an effective-magnetic-field inductively-coupled plasma etching apparatus that is used to etch a layered body.

FIG. 4 is a schematic cross-sectional view showing an OTS device manufacturing apparatus according to the embodiment of the invention, which is used to etch a layered body (the first conductor 12, the OTS portion 13, and the second conductor 14). As a configuration of the manufacturing apparatus 420 (etching apparatus) shown in FIG. 4, an effective-magnetic-field inductively-coupled plasma etching apparatus is adopted; however, the invention is not limited to this.

The manufacturing apparatus 420 includes a chamber 421 that is capable of vacuum pumping. A stage 425 that supports a processing object (substrate/first conductor/OTS portion/second conductor) which is not shown in the figure is disposed inside the chamber 421. An electrostatic chuck that holds a processing object mounted on the stage 425 is provided on the upper surface of the stage 425. The manufacturing apparatus 420 is configured such that chucking of the processing object is carried out by the electrostatic chuck, thereafter He is introduced into a back surface of the processing object, and therefore uniformization of heat of the processing object is achieved. The manufacturing apparatus 420 includes a chiller circulator 426 that controls a temperature of heating medium and circulates the heating medium on the upper surface of the stage 425 or inside the stage 425. The chiller circulator 426 can maintain the stage 425 in a predetermined temperature. In the case an etching apparatus used for a high temperature etching, it is configured so that a heater is built in the stage 425 and a heating temperature is controllable.

An adhesion-preventing plate 423 that partitions a plasma formation space 422 is provided at the periphery of the stage 425. The manufacturing apparatus 420 forms plasma of a processing gas introduced into the plasma formation space 422 and generates a radical of the processing gas. In the embodiment of the invention, although the constituent members (first conductor/OTS portion/second conductor) which form the layered body to be etched are different from each other, the constituent members are etched by using only Ar gas as a processing gas without selecting a different gas depending on the constituent member.

The manufacturing apparatus 420 includes an antenna 428, a high-frequency power supply 429, a magnet unit 430, a gas introduction line, or the like, which serve as a plasma generation mechanism. The antenna 428 is disposed at an upper position of a lid member 424 that closes the upper portion of the plasma formation space 422, that is, outside the chamber 421. The antenna 428 is connected to the high-frequency power supply 429 and forms a high-frequency inductive electric field in the plasma formation space 422.

The magnet unit 430 is disposed between the lid member 424 and the antenna 428 and forms a fixed magnetic field in the plasma formation space 422. The processing gas that is introduced into the plasma formation space 422 through a gas introduction system receives the action of the inductive electric field by the antenna 428 and the action of the fixed magnetic field by the magnet unit 430, and thereby becomes plasma.

The manufacturing apparatus 420 includes a bias power supply 427 that causes the stage 425 to attract ions in plasma. The bias power supply 27 can be formed of a high-frequency power supply.

Hereinbelow, experimental examples which are carried out in order to evaluate the effects obtained by the method of manufacturing an OTS device according to the embodiment of the invention will be described.

In the experimental examples 1 to 3, by use of the manufacturing apparatus shown in FIG. 3, actions and effects of an in-situ process and an ICP process were researched. The step A (formation of the first conductor 12) was carried out in the first film formation space sp1 and the second film formation space sp2, the step B (formation of the OTS portion 13) was carried out in the third film formation space sp3, and the step C (formation of the second conductor 14) was carried out in the fourth film formation space sp4.

Specifically, in the first film formation space sp1, a Ti film was formed as the lower layer 12a of the first conductor 12. In the second film formation space sp2, a Pt film was formed as the upper layer 12b of the first conductor 12. In the third film formation space sp3, a $Ge_4Se_6$ film was formed as the OTS portion 13. In the fourth film formation space sp4, a TiN film was formed as the second conductor 14.

EXPERIMENTAL EXAMPLE 1

In the Example 1, in order to evaluate the effects in the case where the series of the processes which are the aforementioned steps A, B, and C were all carried out under a reduced-pressure atmosphere (in-situ process) and the constituent members (first conductor/OTS portion/second conductor) which form the layered body were formed, a first conductor formed of a lower layer (Ti film)/an upper layer (Pt film) was formed by a sputtering method on a substrate formed of Si in the step A. Thereafter, a surface profile of the constituent member formed by the in-situ process was evaluated by use of STM (or AFM).

EXPERIMENTAL EXAMPLE 2

The experimental example 2 is only different from the experimental example 1 in that an ICP process (step X) is carried out on a surface of the first conductor in in-situ process after the first conductor was formed by the sputtering method in the step A and before carrying out the step B. The other points were the same as those of the experimental example 1.

EXPERIMENTAL EXAMPLE 3

The experimental example 3 is only different from the experimental example 1 in that the first conductor is exposed to an air atmosphere after the first conductor was formed by the sputtering method in the step A and before carrying out the step B. The other points were the same as those of the experimental example 1.

Table 1 is a list including film formation conditions common to the experimental examples 1 to 3. As a processing gas, Ar gas was only used except for the TiN film. In the case of the TiN film, a mixed gas including Ar and $N_2$ was used. Only for the Ti film, film formation was carried out at a room temperature. For the other films, film formation was carried out at 150° C.

Note that, Table 1 also shows film formation conditions of a Mo film that can be used instead of the TiN film constituting the second conductor.

In Table 1, Working Pressure represents a pressure during formation, Power represents electric power applied to a target, Ar Flow represents the flow rate of Ar gas introduced into the inside of the chamber, and Stage Temp. represents a temperature of the stage on which a processing object is mounted.

TABLE 1

|  | $Ge_4Se_6$ | Pt | Ti | TiN | Mo |
|---|---|---|---|---|---|
| Working Pressure [Pa] | $1.4e^{-1}$ | $2e^{-1}$ | $2.1e^{-1}$ | $2e^{-1}$ | $2e^{-1}$ |
| Power [W] | RF_100 | DC_100 | DC_100 | DC_100 | DC_180 |
| Ar Flow [SCCM] | 30 | 40 | 40 | 16 ($N_2$:24) | 40 |
| Stage Temp. [° C.] | 150 | 150 | RT | 150 | 150 |

Table 2 shows conditions of the ICP process (step X) of the experimental example 2, conditions of dry etching a layered body which will be described later (step E), and conditions of ashing a resist (step F).

Here, the step E is a process of dry etching the region of the layered body which is not coated with the resist, in which the second conductor, all of the OTS portion, and an upper portion of the first conductor are removed by an etching treatment at one time (once) using Ar gas in a depth direction of the region.

In Table 2, Working Pressure represents a pressure during operation. Antenna Power represents electric power applied to an antenna. Bias Power represents electric power applied to the stage on which a processing object is mounted. Ar Flow represents the flow rate of Ar gas introduced into the inside of the chamber. Stage Temp. represents a temperature of the stage on which a processing object is mounted.

TABLE 2

|  | ICP | $Ge_4Se_6$ | Pt | TiN | Mo | Ashing |
|---|---|---|---|---|---|---|
| Working Pressure [Pa] | 0.35 | 0.35 | ← | ← | ← | 2.0 |

TABLE 2-continued

|  | ICP | Ge$_4$Se$_6$ | Pt | TiN | Mo | Ashing |
|---|---|---|---|---|---|---|
| Antenna Power [W] | 400 | 400 | ← | ← | ← | 600 |
| Bias Power [W] | 100 | 100 | ← | ← | ← | 50 |
| Ar Flow [SCCM] | 50 | 50 | ← | ← | ← | 25 |
| Stage Temp. [° C.] | RT | RT | ← | ← | ← | ← |

Figure 5A:
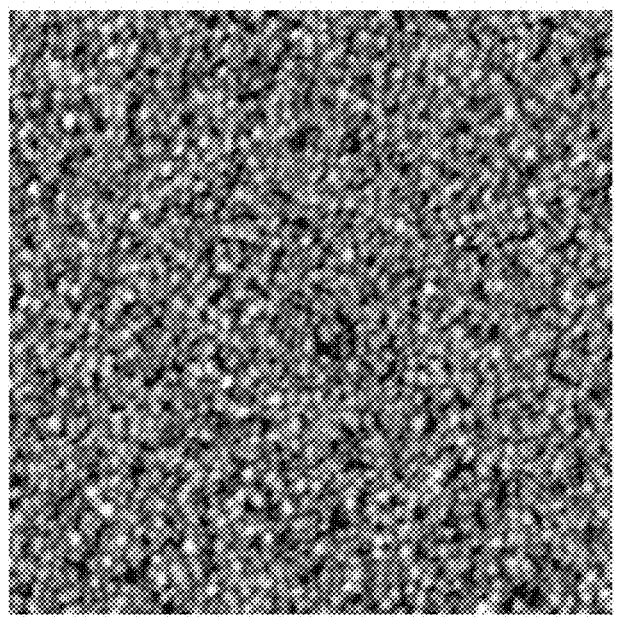
FIG. 5A is a photograph of a surface of the first conductor by use of AFM and is a view showing a state after film formation is carried out.
Figure 5B:
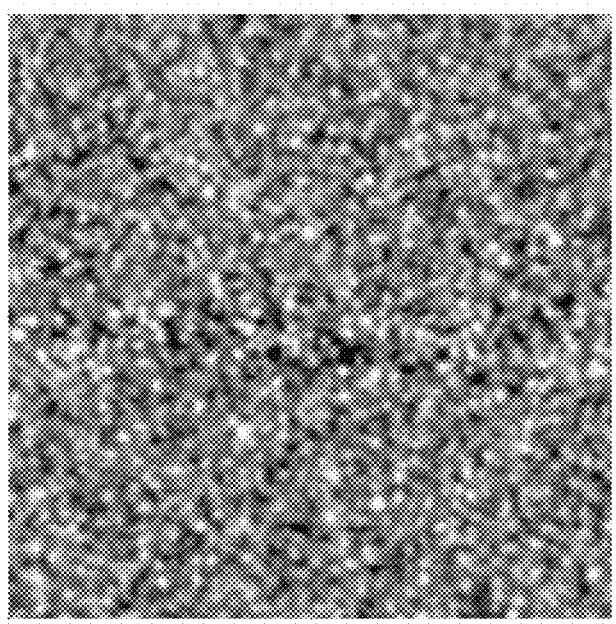
FIG. 5B is a photograph of a surface of the first conductor by use of AFM and is a view showing a state where an ICP processing is carried out after film formation is carried out.

FIG. 5A is a photograph of a surface of the first conductor by use of AFM, a view showing a state after film formation is carried out. FIG. 5B is a photograph of a surface of the first conductor by use of AFM and is a view showing a state where an ICP processing is carried out after film formation is carried out. Here, the surface of the first conductor is the surface of the Pt film which is the upper layer 12b of the first conductor 12. The two numerical values indicated at the lower side of the photographs shown in FIGS. 5A and 5B all show surface roughness and the RMS is "root-mean-square height". "Peak to Valley (hereinbelow, referred to as R$_{p-v}$)" means "difference between the highest point (peak) and the lowest point (Valley) in the measurement range".

The state after film formation is carried out (FIG. 5A) is the evaluation result of the sample of the experimental example 1. Surface roughness of the sample was RMS=0.51 nm and R$_{p-v}$=5.4 nm.

The state where an ICP processing is carried out after film formation is carried out (FIG. 5B) is the evaluation result of the sample of the experimental example 2. Surface roughness of the sample was RMS=0.32 nm and R$_{p-v}$=3.3 nm.

A photograph of a surface of the sample of the experimental example 3 is not shown; however, the surface roughness of the sample thereof was equal to Example 1.

From the above results, the following points were apparent.

(A1) In the Pt film formed by the step A, it is possible to maintain a state where surface roughness thereof is small by maintaining the reduced-pressure atmosphere (in-situ process) (in comparison of the experimental example 1 and the experimental example 3).

(A2) Regarding the Pt film formed by the step A, surface roughness of the Pt film can be in a state of being further small by carrying out the ICP process with respect to the surface of the Pt film in-situ process before the step B is carried out (in comparison of the experimental example 1 and the experimental example 2).

Accordingly, it was found that, by maintaining the Pt film formed by the step A in the reduced-pressure atmosphere (in-situ process) after film formation is carried out and in addition to carrying out the ICP process, it is possible to maintain surface roughness of the Pt film in a state of being small. As irregularities on the surface of Pt film (first conductor) is suppressed, an effect with respect to the OTS portion (step B) and the second conductor (step C) which are to be layered thereabove is reduced.

As a result, according to the embodiment, at a first boundary face between the first conductor and the OTS portion and a second boundary face between the OTS portion and the second conductor, a portion that is locally disturbed on the boundary face can be prevented from being generated.

Hereinbelow, regarding various single-layer films and layered films which are formed by maintaining the reduced-pressure atmosphere (in-situ process), evaluation results by use of SEM of a cross-section after film formation is carried out and a cross-section after etching is carried out will be described. Here, a gas used for etching is only Ar gas.

Figure 6A:
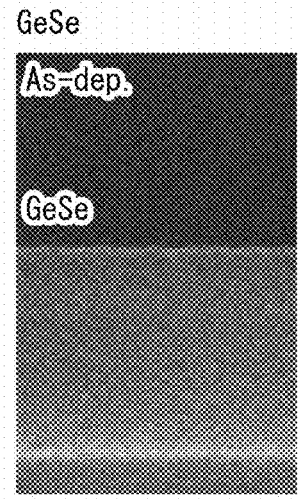
FIG. 6A is a photograph of a cross-section of a GeSe single-layer film by use of SEM and is a view showing a state f.
Figure 6B:
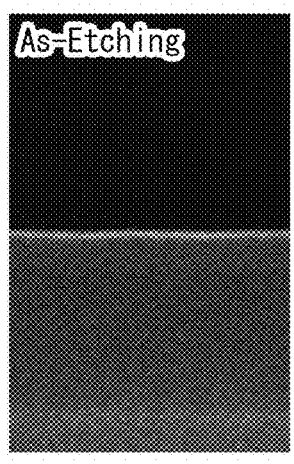
FIG. 6B is a photograph of a cross-section of a GeSe single-layer film by use of SEM and is a view showing a state after etching is carried out.
Figure 7A:
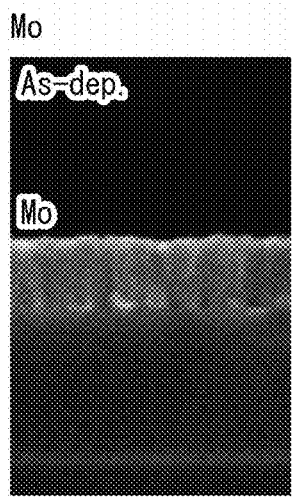
FIG. 7A is a photograph of a cross-section of a Mo single-layer film by use of SEM and is a view showing a state after film formation is carried out.
Figure 7B:
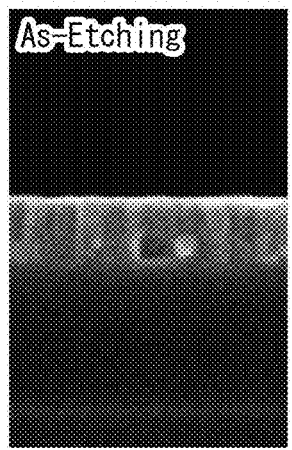
FIG. 7B is a photograph of a cross-section of a Mo single-layer film by use of SEM and is a view showing a state after etching is carried out.
Figure 8A:
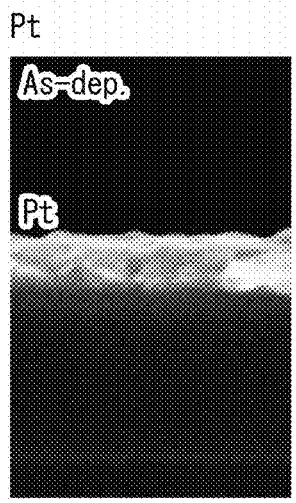
FIG. 8A is a photograph of a cross-section of a Pt single-layer film by use of SEM and is a view showing a state after film formation is carried out.
Figure 8B:
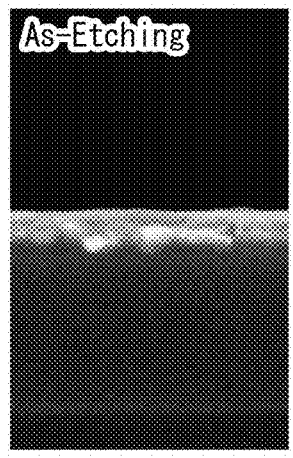
FIG. 8B is a photograph of a cross-section of a Pt single-layer film by use of SEM and is a view showing a state after etching is carried out.
Figure 9A:
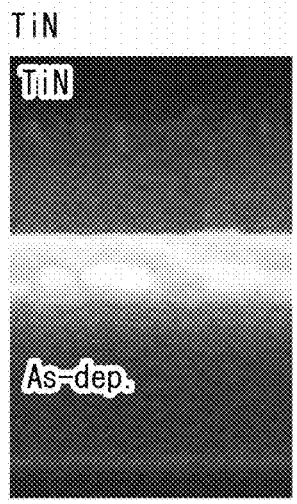
FIG. 9A is a photograph of a cross-section of a TiN single-layer film by use of SEM and is a view showing a state after film formation is carried out.
Figure 9B:
FIG. 9B is a photograph of a cross-section of a TiN single-layer film by use of SEM and is a view showing a state after etching is carried out.
Figure 10A:
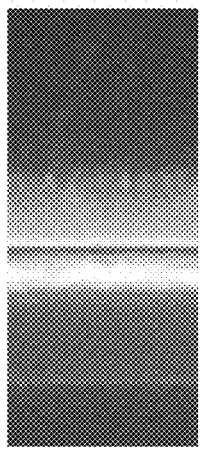
FIG. 10A is a photograph of a cross-section of a TiN/GeSe/Pt layered film by use of SEM and is a view showing a state after film formation is carried out.
Figure 10B:
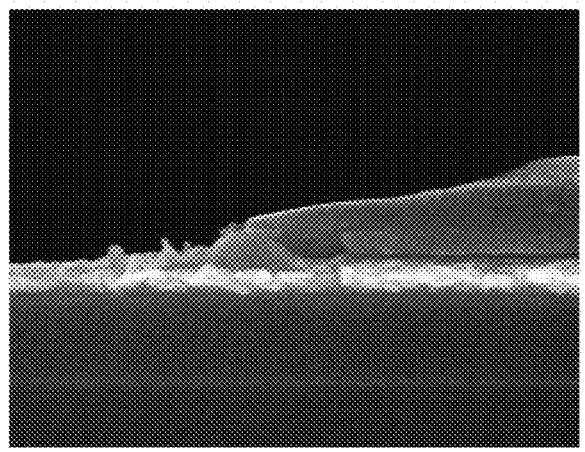
FIG. 10B is a photograph of a cross-section of a TiN/GeSe/Pt layered film by use of SEM and is a view showing a state after etching is carried out.
Figure 11A:
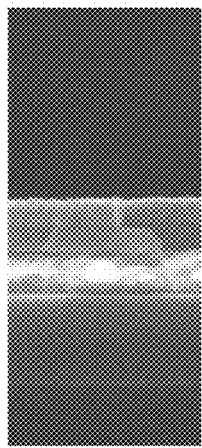
FIG. 11A is a photograph of a cross-section of a Mo/GeSe/Pt layered film by use of SEM and is a view showing a state after film formation is carried out.
Figure 11B:
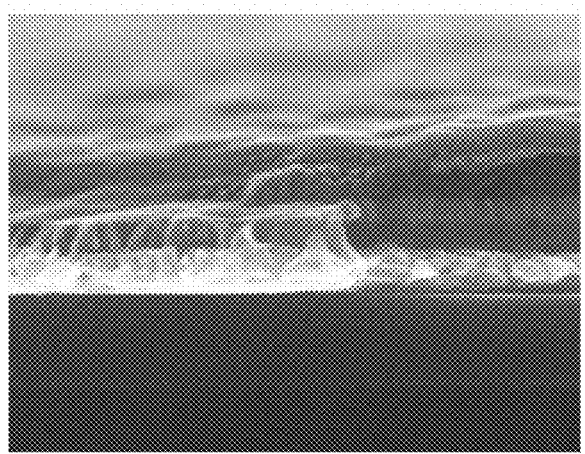
FIG. 11B is a photograph of a cross-section of a Mo/GeSe/Pt layered film by use of SEM and is a view showing a state after etching is carried out.
Figure 12A:
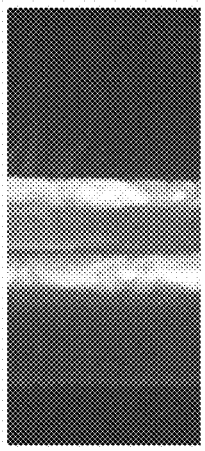
FIG. 12A is a photograph of a cross-section of a Pt/GeSe/Pt layered film by use of SEM and is a view showing a state after film formation is carried out.
Figure 12B:
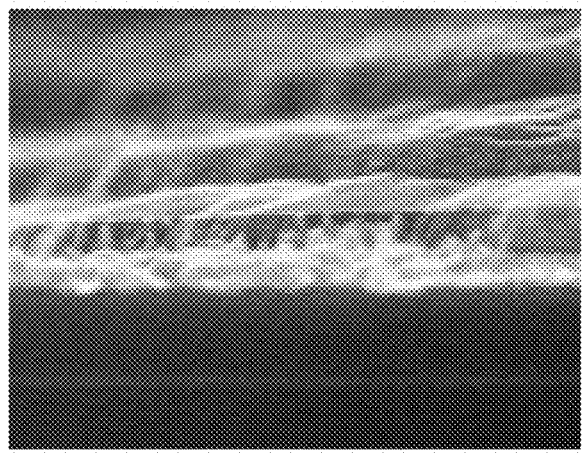
FIG. 12B is a photograph of a cross-section of a Pt/GeSe/Pt layered film by use of SEM and is a view showing a state after etching is carried out.

FIGS. 6A and 6B show photographs of a cross-section of a GeSe single-layer film. FIGS. 7A and 7B show photographs of a cross-section of a Mo single-layer film. FIGS. 8A and 8B show photographs of a cross-section of a Pt single-layer film. FIGS. 9A and 9B show photographs of a cross-section of a TiN single-layer film. FIGS. 10A and 10B show photographs of a cross-section of a TiN/GeSe/Pt layered film. FIGS. 11A and 11B show photographs of a cross-section of a Mo/GeSe/Pt layered film. FIGS. 12A and 12B show photographs of a cross-section of a Pt/GeSe/Pt layered film. FIG. 6A, FIG. 7A, FIG. 8A, FIG. 9A, FIG. 10A, FIG. 11A, and FIG. 12A show photographs of a cross-section after film formation is carried out. FIG. 6B, FIG. 7B, FIG. 8B, FIG. 9B, FIG. 10B, FIG. 11B, and FIG. 12B show photographs of a cross-section after etching is carried out.

From the above results, the following points were apparent.

(B1) From FIG. 6A to FIG. 9B, it was found that, in the surface profiles which are read from photographs showing the cross-section after etching is carried out, the single-layer film does not rely on film materials forming the single-layer film (the GeSe film, the Mo film, the Pt film, and the TiN film) but has substantially the same flatness as that of the case after film formation is carried out or that the flatness thereof is improved as compared with the case after film formation is carried out. Additionally, since it was found that the cross-sectional surface of the film formed by etching is clear, it was determined that damage to the cross-sectional surface thereof does not occur.

(B2) From FIGS. 10A to 12B, also in the case of the layered film, it was determined that the uppermost surface serving as the second conductor (the TiN film, the Mo film, and the Pt film) has a flat surface profile. Furthermore, since a boundary face between interlayers on the cross-sectional surface of the film formed by etching was clearly found, it was determined that damage to the cross-sectional surface thereof does not occur.

Consequently, it was found that, in the case of using the single-layer film or the layered film which is formed while maintaining the reduced-pressure atmosphere (in-situ process), it is possible to remove them by an etching treatment at one time (once) using Ar gas. According to the method of manufacturing an OTS device of the embodiment of the invention, it was determined that, even in the case of using not only the single-layer film but also the layered film, a flat surface, a boundary face, and a cross-sectional surface can be formed.

Figure 13:
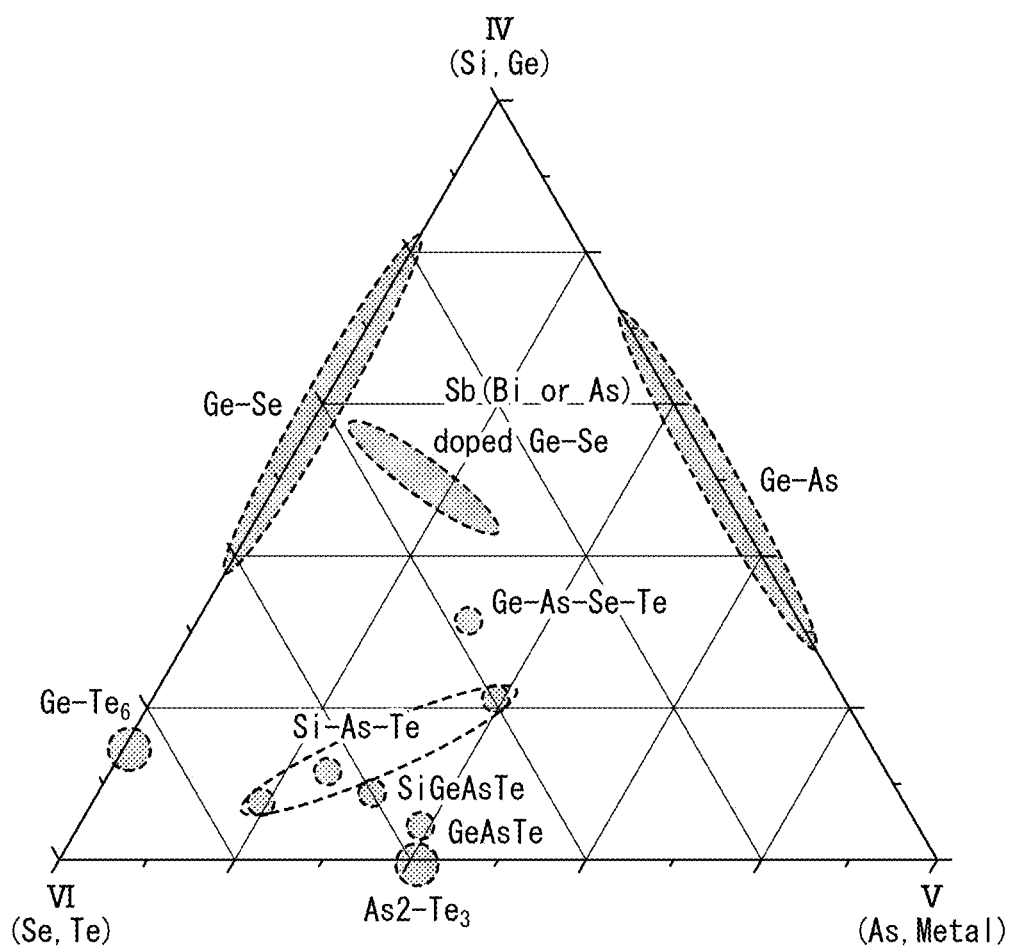
FIG. 13 is a three-dimensional constitution diagram showing main materials of an OTS.

The actions and the effects which are obtained by the method of manufacturing an OTS device according to the embodiment of the invention and are evaluated using the aforementioned GeSe film are not limited to the GeSe film. FIG. 13 is a three-dimensional constitution diagram showing main materials of an OTS. For example, the method of manufacturing an OTS device according to the embodiment of the invention is also effective to a plurality of chalcogenide materials shown in FIG. 13. That is, instead of Ge—Se, Ge—Se, Ge—As—Se—Te, Ge—As, Ge—Te, Si—As—Te, Si—Ge—As—Te, Ge—As—Te, As—Te, Si—Ge—As—Se, into which Sb (Bi or As) is doped, may be used as the OTS portion.

Figure 14:
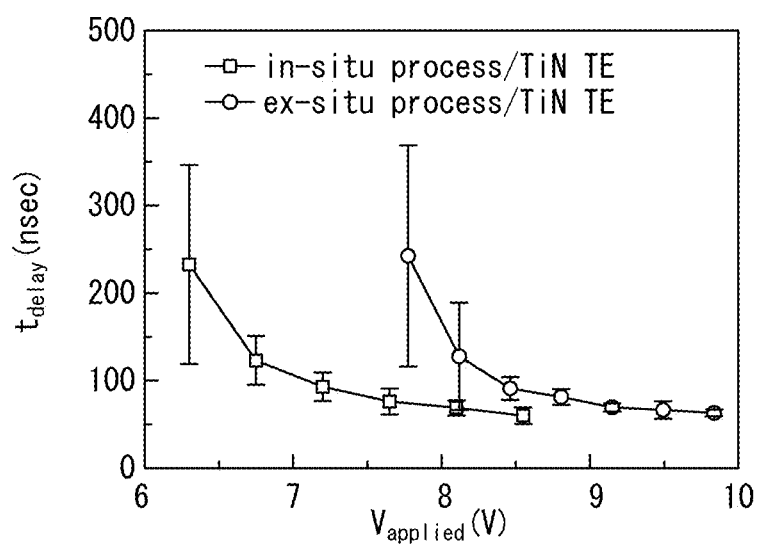
FIG. 14 is a graph showing switching data of an OTS.

FIG. 14 is a graph showing switching data of an OTS. In FIG. 14, the x-axis represents applied voltage (V$_{applied}$ (V)) and the y-axis represents delay time (t$_{delay}$ (nsec)). The evaluated layered body is the TiN/GeSe/Pt layered film shown in FIGS. 10A and 10B. That is, FIG. 14 shows the result that a voltage is applied between the first conductor made of Pt (also referred to as BE) and the second conductor made of TiN (also referred to as TE) via the OTS portion made of GeSe.

In FIG. 14, the mark "☐" shows the result of the OTS device according to the embodiment of the invention (in-situ process: formation of Pt film corresponds to the experimental example 1), and the mark "○" shows the result of a conventional case (ex-situ process: formation of Pt film corresponds to the experimental example 3.

From the results shown in FIG. 14, the following points were apparent.

(C1) In comparison with the conventional OTS device (the mark "○") in which the Pt film is formed, thereafter air exposure (ex-situ process) is carried out, and the GeSe film and the TiN film are provided so as to be layered thereon in order, an equivalent delay time with a further low applied voltage can be achieved in the OTS device (mark "☐") according to the embodiment of the invention in which the Pt film is formed, thereafter the reduced-pressure atmosphere (in-situ process) is maintained, and the GeSe film is formed on the Pt film and TiN film is provided so as to be layered thereon in order. Specifically, a voltage reduction of approximately 2V in applied voltage can be achieved.

(C2) In a way similar to the conventional OTS device (the mark "○"), also in the OTS device (mark "☐") according to the embodiment of the invention, there is a tendency that as the applied voltage decreases, variation in delay time increases. However, in the OTS device (mark "☐") according to the embodiment of the invention, there is a tendency that the variation becomes narrow (the condition in which $t_{delay}$=approximately 120 was observed: in comparison of $V_{applied}$=6.7 of the mark "☐" and $V_{applied}$=8.1 of the mark "○").

Accordingly, the layered film (layered body) formed by the method of manufacturing an OTS device according to the embodiment of the invention, that is, formed by maintaining the reduced-pressure atmosphere (in-situ process) contributes to formation of a OTS device having a high degree of responsivity.

Figure 15:
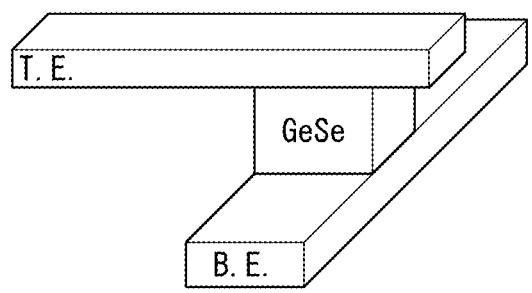
FIG. 15 is a perspective view schematically showing a device configuration.

FIG. 15 is a perspective view schematically showing a device configuration of the OTS device. In FIG. 15, reference letter "B. E." represents a first conductor.

Reference letter "GeSe" represents an OTS portion. Reference letter "T. E." represents a second conductor. "B. E." and "T. E." correspond to a lower electrode and an upper electrode which are used to drive "OTS portion", respectively.

Figure 16:
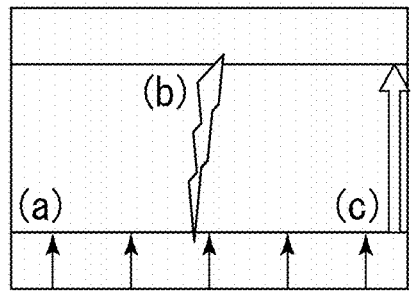
FIG. 16 is a cross-sectional view schematically showing a layered body in the case where a surface of the first conductor is flat.
Figure 17:
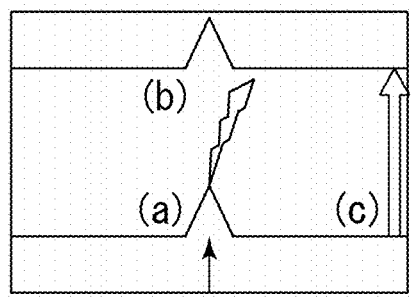
FIG. 17 is a cross-sectional view schematically showing a layered body in the case where a surface of the first conductor has projected portions.

FIGS. 16 and 17 are views for consideration of a state of an electrical current that flows to the inside of the OTS portion in a direction from the lower electrode to the upper electrode in the layered body shown in FIG. 15.

FIG. 16 is a cross-sectional view schematically showing a layered body (the layered body of the invention) in the case where a surface of the first conductor is flat. FIG. 17 is a cross-sectional view schematically showing a layered body (a conventional layered body) in the case where a surface of the first conductor has projected portions.

Meaning of reference signs (a), (b), and (c) shown in FIG. 16 and FIG. 17 are as follows.
(a) Current flow through entire active materials meets electrode area.
(b) Forming of conductive filament.
(c) Devices edge effect.

Since the layered body according to the embodiment of the invention (FIG. 16) adopts the reduced-pressure atmosphere (in-situ process), the surface of the first conductor provides excellent flatness. In accordance with this, at two boundary faces (the boundary face between the first conductor and the OTS portion, and the boundary face between the OTS portion and the second conductor), there is almost no localized irregularities which are a factor causing a flow of an electrical current to be blocked. Furthermore, the cross-sectional surface of the device formed of three layers (first conductor/OTS portion/second conductor) formed by etching is also flat. Consequently, in the layered body according to the embodiment of the invention (FIG. 16), the electrical current flowing from the first conductor to the second conductor through the OTS portion has a smooth flow (smooth flow).

Since a conventional layered body (FIG. 17) is subjected to air exposure (ex-situ process), localized irregularities (for example, a projected portion is shown in FIG. 17) are likely to occur on the surface of the first conductor. In accordance with this, at two boundary faces (the boundary face between the first conductor and the OTS portion, and the boundary face between the OTS portion and the second conductor), there is localized irregularities which are a factor causing a flow of an electrical current to be blocked. Particularly, in the case where a thickness of the OTS portion is thin, the uneven shape generated at the boundary face between the first conductor and the OTS portion are reflected on the boundary face between the OTS portion and the second conductor, and therefore similar irregularities are likely to be generated at the boundary face between the OTS portion and the second conductor. Furthermore, the cross-sectional surface of the device formed of three layers (first conductor/OTS portion/second conductor) formed by etching also has a rough surface. Thus, in the conventional layered body (FIG. 17), the electrical current flowing from the first conductor to the second conductor through the OTS portion is affected by existence of the uneven shape and therefore has a disturbed flow (rough flow).

The inventors considered that the aforementioned results shown in FIG. 14 (graph showing switching data of OTS) are reflected to consideration based on FIGS. 16 and 17. According to the method of manufacturing an OTS device of the embodiment of the invention, as a result of adopting the reduced-pressure atmosphere (in-situ process), the boundary face or the cross-sectional surface of the layered body forming the OTS device provides excellent flatness, and it is consequently possible to achieve excellent switching characteristics.

FIGS. 18A to 20B show results that electrical characteristics were evaluated in the isolated pattern configured of the layered body (FIG. 16) formed by the method of manufacturing an OTS device according to the embodiment of the invention.

Figure 18A:
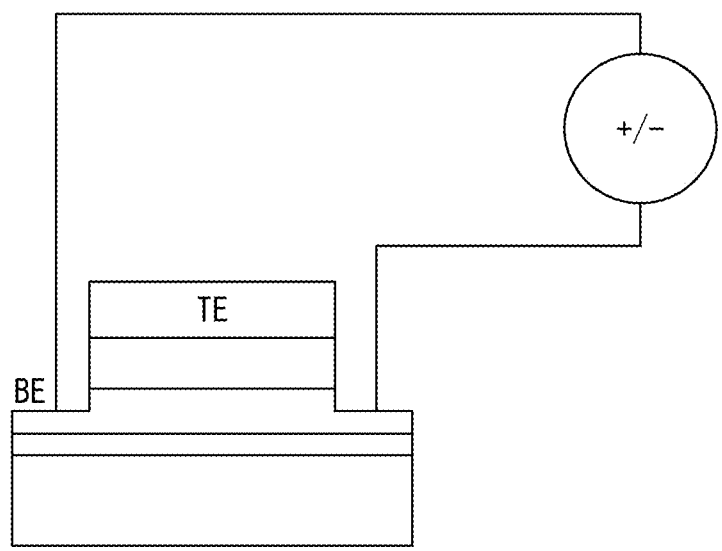
FIG. 18A is a schematic view showing a state of being in bottom-bottom connection in an isolated pattern formed of a layered body.
Figure 18B:
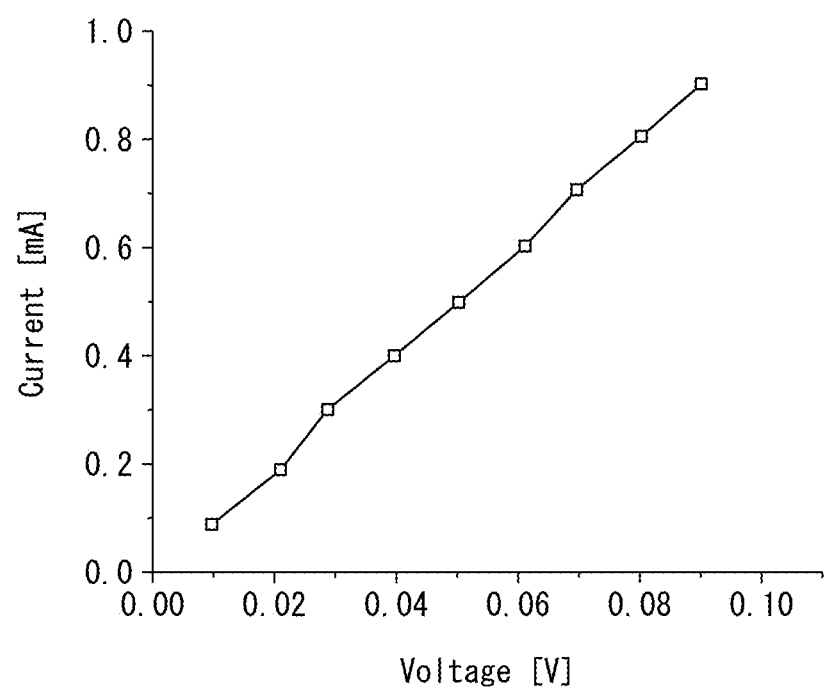
FIG. 18B is a graph showing current-voltage characteristics of the layered body having the isolated pattern shown in FIG. 18A.

FIG. 18A is a schematic view showing a state of being in bottom-bottom connection in an isolated pattern formed of a layered body. FIG. 18B is a graph showing current-voltage characteristics of the layered body having the isolated pattern shown in FIG. 18A.

Figure 19A:
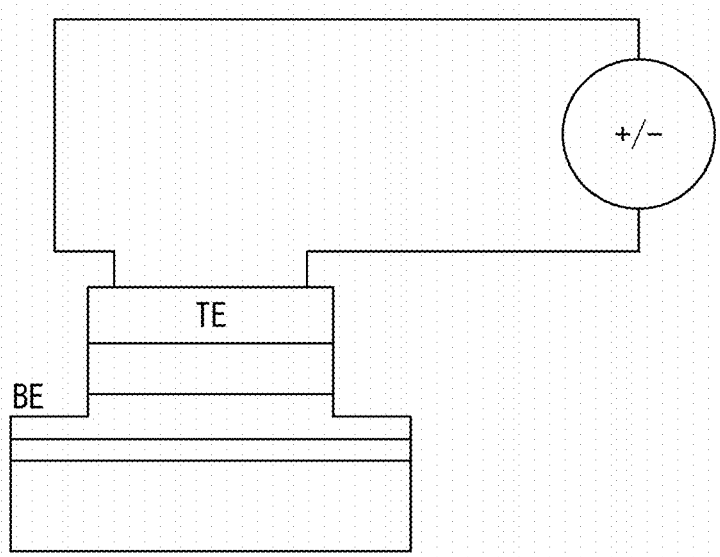
FIG. 19A is a schematic view showing a state of being in top-top connection in an isolated pattern formed of a layered body.
Figure 19B:
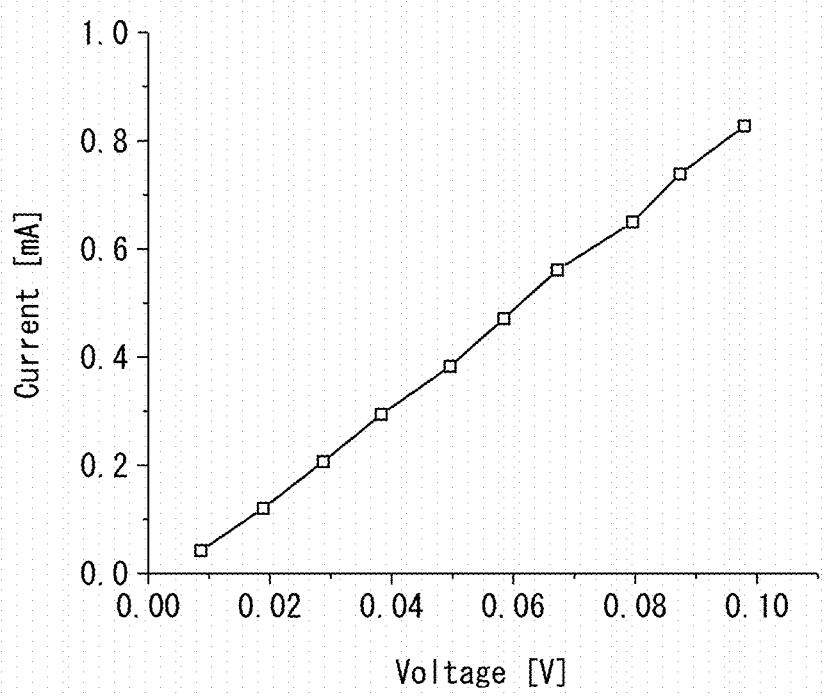
FIG. 19B is a graph showing current-voltage characteristics of the layered body having the isolated pattern shown in FIG. 19A.

FIG. 19A is a schematic view showing a state of being in top-top connection in an isolated pattern formed of a layered body. FIG. 19B is a graph showing current-voltage characteristics of the layered body having the isolated pattern shown in FIG. 19A.

Figure 20A:
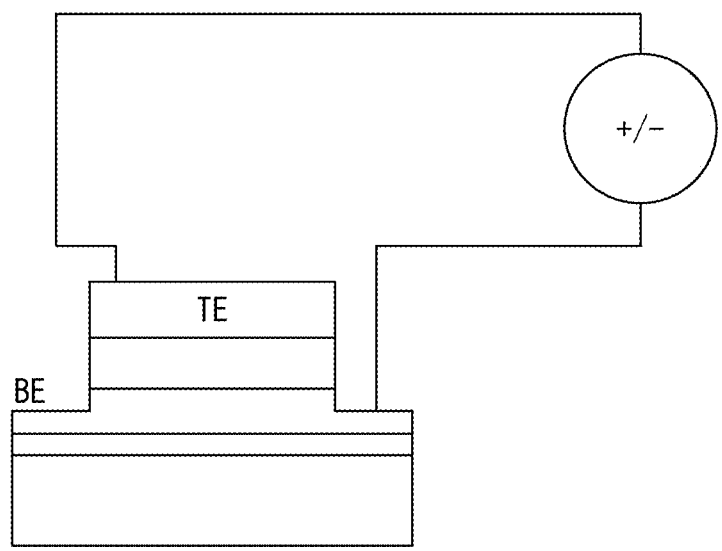
FIG. 20A is a schematic view showing a state of being in bottom-top connection in an isolated pattern formed of a layered body.
Figure 20B:
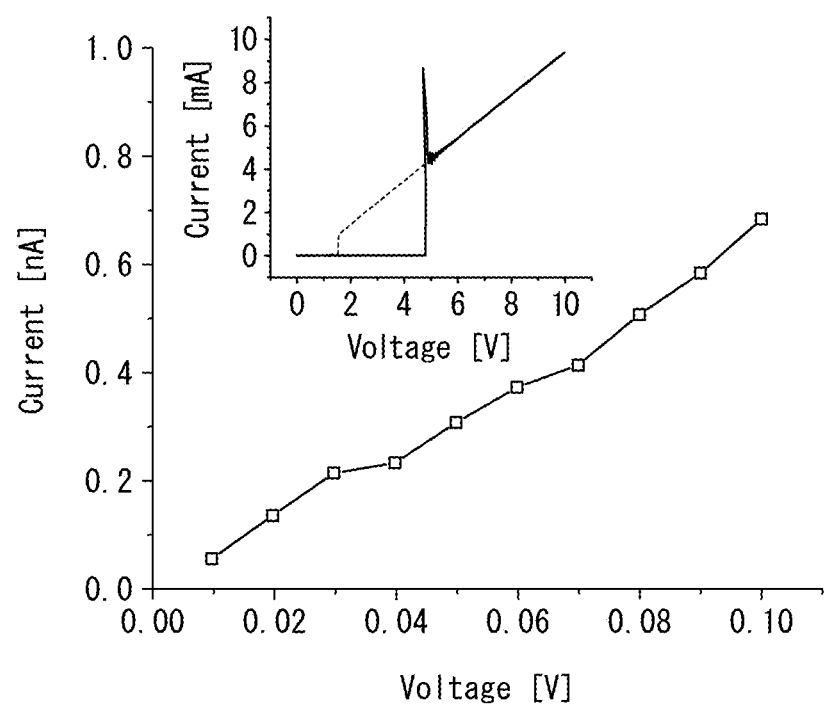
FIG. 20B is a graph showing current-voltage characteristics of the layered body having the isolated pattern shown in FIG. 20A.

FIG. 20A is a schematic view showing a state of being in bottom-top connection in an isolated pattern formed of a layered body. FIG. 20B is a graph showing current-voltage characteristics of the layered body having the isolated pattern shown in FIG. 20A.

It was determined that the current-voltage characteristics (FIGS. 18B, 19B, and 20B) do not rely on difference in an electrical connecting condition (FIGS. 18A, 19A, and 20A) and linearity thereof is maintained. The reason why the above-described current-voltage characteristics are obtained is because the boundary face of the layered body or the cross-sectional surface provides excellent flatness and therefore the characteristics can be achieved as a result of adopting the sequent steps carried out under the reduced-pressure atmosphere (in-situ process) in the method of manufacturing an OTS device according to the embodiment of the invention.

In order to obtain the aforementioned current-voltage characteristics (FIGS. 18B, 19B, and 20B), on an insulating substrate, first conductor, the inventors found out that satisfaction of relational expression of $R_{p\text{-}v} \leq (T_x/10)$ by surface roughness of the first conductor ($R_{p\text{-}v}$ (nm)) and a thickness of the OTS portion ($T_x$ (nm)) is a key point in the OTS device including the first conductor, the OTS portion made of chalcogenide, and the second conductor which are layered in order and disposed on an insulating substrate.

Figure 21:
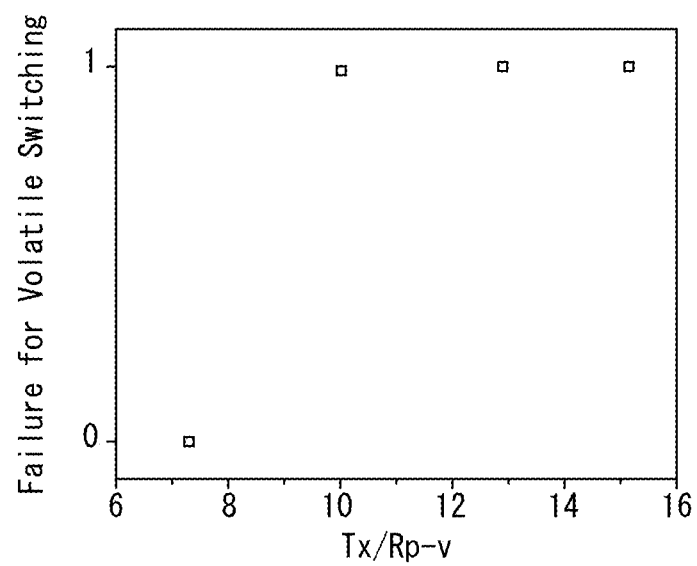
FIG. 21 is a chart indicating that relational expression of $R_{p\text{-}v} \leq (T_x/10)$ is satisfied.

FIG. 21 is a chart indicating that the above-mentioned current-voltage characteristics (FIGS. 18B, 19B, and 20B) is obtained by the satisfaction of the relational expression. Regarding the y-axis of FIG. 21, "1" represents volatil switching (volatile switching), and "0" represents non-volatil switching (nonvolatile switching).

That is, it was determined from FIG. 21 that, in the case where $T_x/R_{p\text{-}v} \geq 10$ is satisfied, it is volatil switching, in the case where $T_x/R_{p\text{-}v} < 10$ is satisfied, it is non-volatil switching.

Furthermore, it was found that, when surface roughness $R_{p\text{-}v}$ of the first conductor is less than or equal to 3.3 nm in the case where the aforementioned relational expression is satisfied, the above-described current-voltage characteristics (FIGS. 18B, 19B, and 20B) are further stably obtained, and it is more preferable.

As described above, the method of manufacturing an OTS device according to the embodiment of the invention and the OTS device are explained; however, the invention is not limited to the above, modifications may be made as appropriate without departing from the scope of the invention.

INDUSTRIAL APPLICABILITY

The invention is widely applicable to a method of manufacturing an OTS device and an OTS device. The invention is preferably used to, for example, metal oxide silicon field effect transmitter (MOSFET), a bipolar junction transistor (BJT), a cell selection device such as a PN diode, a three-dimensional stack memory device, or the like.

DESCRIPTION OF REFERENCE NUMERALS 11 substrate, 12 first conductor, 12a lower layer, 12b upper layer, 13 OTS portion, 14 second conductor, 15 layered body, 16 resist.

What is claimed is:

1. A method of manufacturing an Ovonic Threshold Switch (OTS) device including a first conductor, an OTS portion made of chalcogenide, and a second conductor which are layered in order and disposed on an insulating substrate, the method comprising:
a step A of forming the first conductor over an entire area a surface of the substrate;
a step X carrying out a flattening treatment by an ICP method using Ar gas with respect to a surface of the first conductor formed by the step A;
a step B of forming the OTS portion over an entire area of the first conductor;
a step C of forming the second conductor over an entire area of the OTS portion;
a step D of forming a resist so as to coat part of an upper surface of the second conductor;
a step E of dry etching a region which is not coated with the resist; and
a step F of ashing the resist, wherein
in the step E, the second conductor, all of the OTS portion, and an upper portion of the first conductor are removed by an etching treatment once in a depth direction of the region, and
the step X is carried out between the step A and the step B.

2. The method of manufacturing an OTS device according to claim 1, wherein
the step A, the step B, and the step C are all carried out in a space under reduced pressure, and
the steps A, B, and C are sequent in-situ process.

3. The method of manufacturing an OTS device according to claim 1, wherein the dry etching of the step E is a plasma treatment using Ar gas.

4. An OTS device manufactured by a manufacturing method, the Ovonic Threshold Switch (OTS) device comprising a first conductor, an OTS portion made of chalcogenide, and a second conductor which are layered in order and disposed on an insulating substrate, the method comprising:
a step A of forming the first conductor over an entire area a surface of the substrate;
a step X carrying out a flattening treatment by an ICP method using Ar gas with respect to a surface of the first conductor formed by the step A;
a step B of forming the OTS portion over an entire area of the first conductor;
a step C of forming the second conductor over an entire area of the OTS portion;
a step D of forming a resist so as to coat part of an upper surface of the second conductor;
a step E of dry etching a region which is not coated with the resist; and
a step F of ashing the resist, wherein
in the step E, the second conductor, all of the OTS portion, and an upper portion of the first conductor are removed by an etching treatment once in a depth direction of the region, and
the step X is carried out between the step A and the step B, and wherein
when surface roughness of the first conductor is defined as $R_{p\text{-}v}$ and a thickness of the OTS portion is defined as $T_x$, relational expression of $R_{p\text{-}v} \leq (T_x/10)$ is satisfied.

5. The OTS device according to claim 4, wherein the surface roughness $R_{p\text{-}v}$ of the first conductor is less than or equal to 3.3 nm.

* * * * *